April 4, 1967 B. NORTON ET AL 3,312,572

PROCESS OF PREPARING THIN FILM SEMICONDUCTOR THERMISTOR BOLOMETERS AND ARTICLES

Filed June 7, 1963

INVENTORS
BRUCE NORTON
HENRY LEVINSTEIN
BY
Robert Ames Norton
ATTORNEY 3,312,572

PROCESS OF PREPARING THIN FILM SEMICONDUCTOR THERMISTOR BOLOMETERS AND ARTICLES

Bruce Norton, Westport, Conn., and Henry Levinstein, Syracuse, N.Y., assignors to Barnes Engineering Company, Stamford, Conn., a corporation of Delaware
Filed June 7, 1963, Ser. No. 286,287
14 Claims. (Cl. 117—212)

Figure 1:
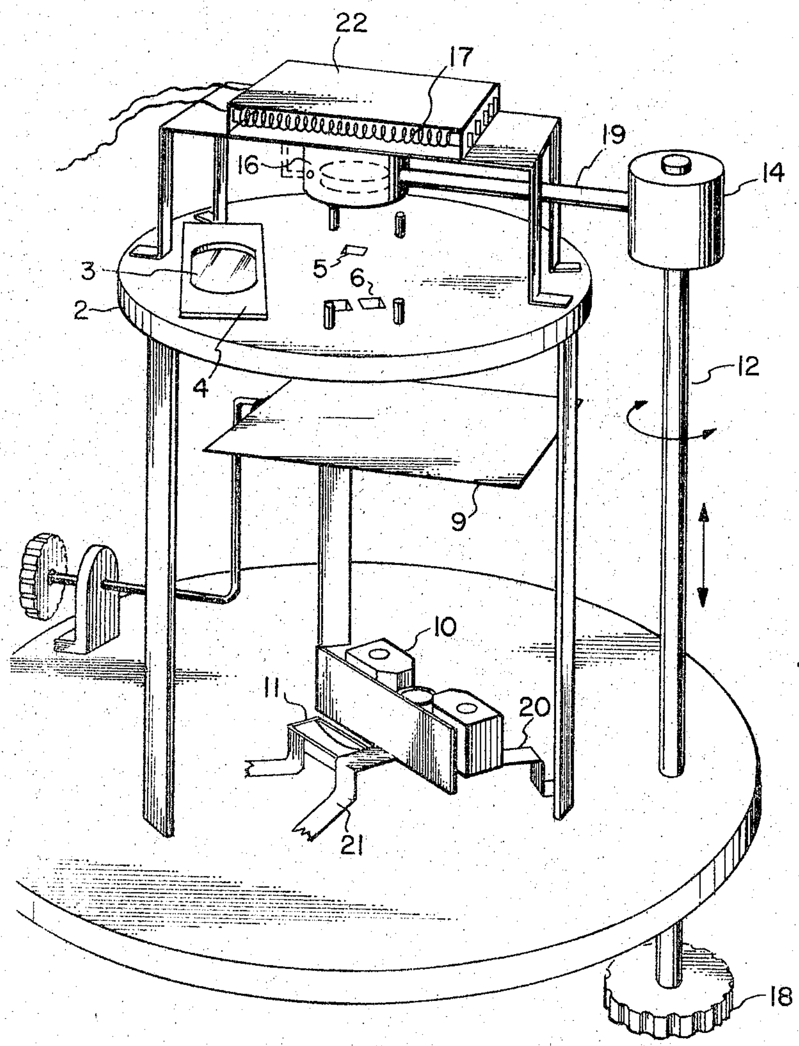

This invention relates to an improved process for preparing thin-film semiconductor thermistor bolometers having films of germanium or silicon and an improved thermistor bolometer.

In the patent to De Waard, No. 2,994,053, July 25, 1961, there are described and claimed new types of thermistor bolometers in which the thermally sensitive material, or thermistor, is composed of a very thin film of germanium or silicon. These new bolometers have important advantages, including increased responsivity, shorter time constant, and the like. The bolometers also presented another desirable characteristic in that they made possible very uniform and very economical production of the thermistor films themselves by vacuum evaporation.

To achieve maximum economies it would be desirable to make the whole bolometer, thin-film thermistor, leads, and, if required, an insulating layer for immersed bolometers, all by vacuum evaporation. The production of the thin thermistor films themselves was easily effected, using normal precautions current in the vacuum deposition art. However, when it was attempted to attach leads, or more precisely contacts for leads, to the thermistor also by evaporation techniques serious manufacturing problems were encountered. A number of materials proved unsatisfactory for leads when vacuum deposition was attempted. Thus, for example, thin films of germanium proved to be of N-type germanium, and therefore, of course, no P-type material could be used in evaporation, as otherwise a PN junction is produced which acts as a diode and is unsuitable for thermistor bolometers because of noise and other drawbacks. This immediately eliminated the use of gold, which for many purposes is a very satisfactory lead material, but it is P-type, and so could not be vacuum deposited onto the thin germanium film without junction formation. Various other types of material also proved unsuitable; for example, phosphorus and arsenic, although N-type materials, could not be used because they doped the thin film of germanium. Certain other metals, such as tantalum, were too high in their melting point for satisfactory vacuum evaporation. Finally, two materials, antimony and bismuth, were found to lend themselves to satisfactory deposition, particularly the former. However, when it was attempted to vacuum deposit antimony leads, reproducibility left much to be desired. Some bolometers were produced which had satisfactory lead contacts, but others exhibited weak diode effects and were noisy. It is with a solution of this problem, and the production of uniformly reproducible bolometers that the present invention deals.

It was found that the problems in the contacts of antimony leads vacuum deposited on semiconductor thermistors, such as thin germanium films, were serious when the thermistors were prepared by conventional methods, that is to say, vacuum deposited through a suitable mask onto preformed germanium films which had been removed from the vacuum deposition apparatus. Apparently there was some reaction of the germanium with the atmosphere. The amount of reaction is extremely slight, and cannot be definitely analyzed. It is believed, however, that the reaction produces a minute oxide film on the surface of the germanium which, on further deposition of antimony, produces a weak diode junction. The exact compound of the germanium with oxygen has not been determined, and it did not always form, as some bolometers produced by the standard methods of vacuum deposition involving intermediate exposure to the atmosphere did not show the undesired diode effects.

According to the present invention, the problem of producing reliably and reproducibly germanium and silicon thermistor bolometers with antimony or bismuth lead contacts vacuum deposited is solved by maintaining the germanium film or silicon film out of contact with oxygen. This is best done by carrying out both the operations of film deposition and lead contact deposition in the same vacuum apparatus without breaking vacuum. This is the preferred modification of the present invention, although any other means, such as flushing with an inert atmosphere, can be used. However, the manufacturing efficiencies of the continuous vacuum modification are so great that this is the preferred embodiment of the present invention.

It is an advantage of the present invention that ordinary vacuum equipment may be used. However, it should be realized that it is also necessary to maintain certain other operating conditions within definite ranges. These ranges are by no means critical, but they must be followed if uniform, high-quality bolometers are to be produced. Therefore, while the great advance of the process of the present invention consists in the elimination of contact with oxygen from the time the germanium or silicon film is first deposited and the antimony or bismuth leads deposited thereon is the most important single feature, it must be used with quite definite ranges of temperatures and certain other operating conditions which will be described below.

The temperature of the substrate on which the original semiconductor film is deposited is of the greatest importance in order to produce bolometers of practically useful resistivities. The range is from 120° C. to 170° C., with excellent results being obtainable between 130° C. and 145° C.

The chemical or other nature of the substrate is relatively unimportant so long as it does not contain compounds which combine with the semiconductor. Thus, for example, in the case of germanium films, the substrate must be completely free from arsenic. The substrate may be a dielectric, such as fused aluminum oxide, usually referred to in the art as sapphire, diamond, or insulating films on electrically conductive material such as layers of selenium glass, care being taken that the glass is completely free from arsenic or other dopants, plastic layers free of dopants, and the like. The bolometers produced may be unimmersed, for example, deposited on substrates which act as heat sinks, such as, for example, sapphire or copper or aluminum with an insulating coating which may be accurately dimensioned to obtain desired bolometer time constants or the like. Or the heat sink or substrate may be in the form of a lens, such as a lens of sapphire, germanium and the like, in which case an immersed bolometer is produced, with its concomitant greater responsivity.

The present process does not alter in any way the important characteristics of the semiconductor thermistors as they are described in the De Waard patent referred to above. Thus, for example, the thin films are practically transparent to the infrared, and so permit optical arrangements in which radiation passes through the thermistor film and is absorbed by an absorbing layer in contact therewith. This characteristic is particularly stressed in the De Waard patent, as it makes possible not only highly effective bolometers of ordinary design, but also permits immersed selective bolometers and other special types of infrared detectors. The present process is applicable to all of these bolometers, and does not change their characteristics. Therefore, in the remainder of the present specification, the use of the process on a simple unimmersed bolometer with a sapphire heat sink will be described. The process, of course, has the same advantages and produces the same regularly reproducible results when used with other designs of bolometers, such as the various types of immersed bolometers.

Figure 2:
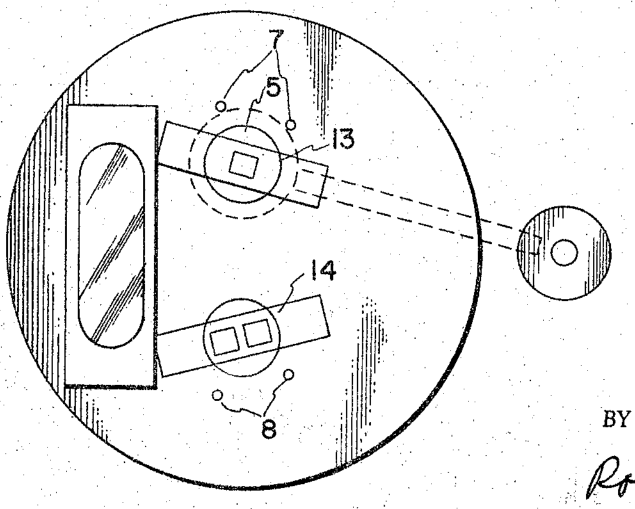

The invention will be described in greater detail in conjunction with the following specific examples, which are illustrative of the production of typical unimmersed thermistor bolometers. The description will also be in connection with the drawings, in which:

FIG. 1 is an isometric, semi-diagrammatic view of the mechanism in a vacuum deposition apparatus, and FIG. 2 is a plan view of the plate shown in FIG. 1.

FIG. 1 shows in semi-diagrammatic form the operating mechanism of a vacuum system with the bell jar removed for clarity. The base of the vacuum system is the customary heavy base plate 1 on which there is mounted a plate 2 at a suitable height with three openings 3, 5, and 6, the latter two being provided with suitable masks 13 and 14, and locating pins for the latter two openings 7 and 8 respectively.

The conventional shutter is shown diagrammatically at 9, which can be opened for the desired short period of time during which deposition takes place. Also shown are boats or crucibles for the two materials. 10 is a carbon crucible which contains germanium to be evaporated in the form of the thin germanium film. 11 is a molybdenum boat which is used for vaporizing the antimony for the leads. Only parts of the electric heating leads 20 for the carbon crucible and 21 for the molybdenum boat are shown, as they are conventional and are in no way changed by the present invention.

An arm 12 passes through the base plate 1 with a vacuum-tight sealing. The arm can be moved up or down, or rotated as is shown by the arrows, and is provided externally with a suitable knob 18. A casting 14 at the desired height carries an arm 19 on which there is mounted a holder 16 containing a sapphire substrate 17. The whole mechanism is the conventional, commercially available rotary fed-through device for vacuum deposition equipment, and is not changed by the present invention. A radiant substrate heater is also shown at 22.

*Example 1.*—An accurately weighed slide 3 is placed over the opening 4 and metallic germanium is placed in the carbon crucible 10 and metallic antimony in the molybdenum boat 11. The knob 18 is then manipulated to bring the substrate 17 into register over the opening 5, registration being effected by cautiously lowering the holder 16 against the locating pins 7. The opening in the mask 13 has a width of 6 mm.

The vacuum bell jar is lowered, and the system evacuated in the normal manner, until a vacuum of somewhat better than $2\times10^{-5}$ mm. Hg is reached. In the meantime, the sapphire substrate, which is in the form of a heat sink of substantial thickness, is brought up to a temperature of 130° C. by the heater 22. The graphite crucible 10 is heated up to from 1700° C. to 1800° C., the shutter 9 being closed. The shutter is then opened and coating of the sapphire substrate with germanium proceeds at the rate of approximately 800 A. per minute. A coating of from $0.36\mu$ to $0.44\mu$ is produced. During the coating procedure, the temperature of the substrate rises to approximately 145° C.

The shutter 9 is closed and power to the crucible 10 is then turned off, the knob 18 is manipulated to raise the holder 16 along the pins 7, turn it, and lower it along the pins 8 which serve to locate the substrate with the deposited germanium thermistor film above the mask 14. The mask has two openings separated by a narrow rectangular strip. The mask, as is the case with mask 13, is preferably made of 1 mil stainless steel. The strip across the center of the mask is 1 mm. wide. The temperature of the substrate is raised to approximately 150° C. and the molybdenum boat 11 heated to about 750° C. The shutter 9 is then opened, and antimony is deposited through the mask 14 until the deposit is about 1200 A. This takes from 5 to 10 seconds. Again, shutter 9 is closed before the boat is turned off. The power to the molybdenum boat is turned off, and the substrate and thermistor with antimony contacts allowed slowly to cool, resulting in an annealing effect. The cooling time is at least two hours, and preferably four, and cooling should continue until the substrate temperature is not over 50° C. and preferably not over 35° C. Vacuum is then broken and the substrate 17 with germanium thermistor and antimony contacts removed. The resulting thermistor bolometer is provided with leads connected to the antimony contacts and to suitable pins in a conventional bolometer capsule.

On test the bolometer showed a temperature coefficient of about −3% per degree C. at 25° C. ambient temperature, and at this temperature showed a responsivity at least double that of the best oxide thermistor bolometers in the same configuration. It should be noted that thermistor bolometers must be compared in the same configuration, because if it is possible to concentrate the radiation on a smaller area, for example, by immersion or other techniques, greater responsivities can be obtained.

The example given above is for a rather large thermistor bolometer, suitable for many uses where a wide angle of view is needed. It might be wondered why the markedly higher responsivity is obtained, although the temperature coefficient of the thermistor described is slightly lower than that of the best oxide thermistors at the same ambient temperature. Primarily two important practical factors account for the marked increase in responsivity. The mass of the thermistor is considerably less because of its great thinness, and, what in many cases is even more important, the germanium thermistor can be used with very much higher bias voltages. For example, the peak bias voltage may reach 800 v., and a safe working voltage is about 500 v. This is somewhat more than twice that which is safe with an oxide thermistor of the same configuration on the same heat sink. Other things being equal, responsivity increases linearly with bias voltage, and the much higher safe working voltage of the germanium thermistor permits higher responsivity.

It should be noted that the antimony contacts are purely resistive, and do not show diode effects, which was the big problem in the past with vacuum deposited lead contacts. As a result, the contacts are not noisy, and so an excellent signal-to-noise ratio can be obtained because the principal noise in a semiconductor film is that by generation of holes and recombination, rather than the straight current or Johnson noise. The increase in the generation-combination noise is much slower than the increase in responsivity when increased bias voltages and hence currents are used. In fact, this increase in noise is roughly proportional to the cube root of the increase in responsivity. Thus, by raising the bias voltage, responsivity, may be increased about eight times with an increase of noise of only approximately double.

*Example 2.*—When the process described above is repeated, using bismuth instead of antimony for lead contacts, resistive contacts are obtained, and the resulting thermistor bolometer has approximately the same properties.

The description above is for a practical process of producing a thermistor bolometer, but it should be understood that the temperature at which the germanium and antimony are evaporated is a practical one, and may vary somewhat. For example, the temperature of the germanium may be somewhat below 1700° C. and may be as high as 2000° C. Similarly, the temperatures at which the antimony is vaporized may be as low as a little under 700°

C. and as high as 800° C. In general, these temperature limits, while necessary, are not sharply critical. If the temperature is too low, coating time becomes excessive, and uniformity suffers a little, and if the temperature is too high, the coating time becomes uncomfortably short. The temperatures given above in the specific examples represent good manufacturing practice.

One of the advantages of the present invention is that the vacuum deposition process readily lends itself to large scale manufacturing. For purposes of illustration of the process, the example was described in conjunction with vacuum equipment to produce a single thermistor bolometer at a time. This equipment, in which the moving of the substrate from one mask to another is effected manually, is commonly used for experimental work, or where special thermistor bolometers are to be produced in small amounts. Where, however, a standard bolometer is to be produced in large amounts, automatic machinery is useful which transports the substrates from one station to another. Such a machine, designed for the production of vacuum evaporated thermopiles, is described and claimed in the copending application of Weiner and Hall, Ser. No. 271,155 filed Apr. 8, 1963.

In the machine for producing vacuum evaporated thermopiles, there were three evaporations, and therefore three stations at which the thermopiles are successively positioned. In the case of the thermistor bolometers of the present invention, there will be two evaporations when the bolometer is unimmersed or immersed on an insulating lens, but where there is used a conducting lens, such as a lens of germanium, there is required a third evaporation to lay down a suitable insulating film free from dopant between the lens and the semiconductor thermistor. The number of stations in automatic machines, of course, is determined by the number of different evaporations which are required. The present invention is directed to a process, and while it is an advantage that known automatic machinery can be used, the invention is not limited to any particular design of vacuum system.

We claim:

1. A process for the preparation of thin-film, semiconductor thermistor bolometers by vacuum evaporation comprising, (a) heating a bolometer substrate to from 120° C. to 170° C. in the absence of oxygen, (b) vacuum evaporating onto a predetermined area of the bolometer substrate a thin layer of a semiconductor selected from the group consisting of germanium and silicon, (c) without exposing the film of the semiconductor to contact with oxygen, vacuum evaporating on predetermined portions of the film contacts consisting of thin layers of a metal selected from the group consisting of antimony and bismuth, and (d) annealing the bolometer produced by slow cooling in the absence of oxygen to a temperature not substantially exceeding 50° C.

2. A process according to claim 1 in which the vacuum evaporated contact layers are of antimony.

3. A process according to claim 1 in which steps (b) and (c) are carried out without breaking vacuum.

4. A process according to claim 1 in which the semiconductor film is of germanium.

5. A process according to claim 4 in which steps (b) and (c) are carried out without breaking vacuum.

6. A process according to claim 4 in which the bolometer substrate is heated to from 130° C. to 145° C.

7. A process according to claim 4 in which the germanium is vacuum evaporated from a crucible free from dopants for germanium at a crucible temperature between 1700° C. and 1800° C.

8. A process according to claim 4 in which the vacuum evaporated contact layers are of antimony.

9. A process according to claim 8 in which steps (b) and (c) are carried out without breaking vacuum.

10. A process according to claim 8 in which the antimony contacts are evaporated from a crucible free from dopants at a crucible temperature between 700° C. and 800° C.

11. A thermistor bolometer comprising, in combination, (a) a bolometer substrate having a thin film of a semiconductor selected from the group consisting of germanium and silicon thereon, (b) vacuum evaporated contact layers on predetermined portions of the semiconductor film, said contacts being formed of a metal selected from the group consisting of antimony and bismuth, (c) the contacts between the metal and the semiconductor being purely resistive and free from any oxygen compounds at the interface between metal and semiconductor.

12. A thermistor bolometer according to claim 11 in which the semiconductor thermistor is germanium.

13. A thermistor bolometer according to claim 11 in which the contacts are of vacuum evaporated antimony.

14. A thermistor bolometer according to claim 12 in which the contacts are of vacuum evaporated antimony.

References Cited by the Examiner

UNITED STATES PATENTS

| | | | |
|---|---|---|---|
| 2,983,887 | 5/1961 | Wormser | 338—18 |
| 2,994,053 | 7/1961 | De Waard | 338—18 |
| 3,091,555 | 5/1963 | Smythe | 117—201 |
| 3,096,209 | 7/1963 | Ingham | 117—201 |

ALFRED L. LEAVITT, *Primary Examiner.*

WILLIAM L. JARVIS, *Examiner.*